United States Patent [19]
Love

[11] Patent Number: 5,363,038
[45] Date of Patent: Nov. 8, 1994

[54] METHOD AND APPARATUS FOR TESTING AN UNPOPULATED CHIP CARRIER USING A MODULE TEST CARD

[75] Inventor: David G. Love, Pleasanton, Calif.

[73] Assignee: Fujitsu Limited, Kanagawa, Japan

[21] Appl. No.: 929,000

[22] Filed: Aug. 12, 1992

[51] Int. Cl.$^5$ .............................. G01R 1/04
[52] U.S. Cl. .................. 324/158.1; 439/86
[58] Field of Search ........... 324/158 F, 158 P, 158 R, 324/73.1; 439/86, 80

[56] References Cited

U.S. PATENT DOCUMENTS

| | | | |
|---|---|---|---|
| 3,634,807 | 2/1972 | Grobe | 339/17 |
| 3,746,973 | 7/1973 | McMahon, Jr. | 324/51 |
| 4,912,401 | 3/1990 | Nady, II et al. | 324/158 F |
| 4,937,203 | 6/1990 | Eichelberger et al. | 437/81 |
| 5,007,163 | 4/1991 | Pope et al. | 29/840 |
| 5,046,953 | 9/1991 | Shreeve et al. | 439/66 |
| 5,049,084 | 9/1991 | Bakke | 439/66 |
| 5,053,698 | 10/1991 | Ueda | 324/158 |

*Primary Examiner*—Louis Arana
*Assistant Examiner*—Barry C. Bowser
*Attorney, Agent, or Firm*—Christie, Parker & Hale

[57] ABSTRACT

Manufacturing of semiconductor devices is facilitated when the device chip carriers of the devices are tested, prior to population of chips thereon, by a module test card. The module test card is formed by a test substrate and a plurality of test chips mounted on the test substrate. Connections are provided on the test substrate for connecting to a tester. Through the module test card, the device chip carriers are tested under simulation of their operating conditions.

20 Claims, 6 Drawing Sheets

METHOD AND APPARATUS FOR TESTING AN UNPOPULATED CHIP CARRIER USING A MODULE TEST CARD

TECHNICAL FIELD

This invention relates in general to semiconductor device packaging and in particular to carriers of semiconductor chips. More specifically, this invention relates to a technique and apparatus for increasing yield in the manufacturing of semiconductor devices by testing the carriers prior to population of chips thereon.

BACKGROUND OF THE INVENTION

The increasing complexity of electronic systems have led not only to the use of semiconductor chips with increasing scale of integration, but also of chip carriers with smaller bond pad geometries, closer bond pad pitches and higher net counts. Furthermore, as electronic circuits become faster and signal timings become more crucial, less tolerances are now affordable for deviations in electrical properties, such as resistance, inductance and capacitance, of carriers. As a result, it has become increasingly more difficult to attain high yield in the production of both chips and chip carriers. Compounding the problem is the growing cost of rework that is caused by the increasing scale of integration and the common use of multi-chip carriers.

For the above stated reasons, it has become economically important in the manufacturing of semiconductor devices not only to test the chips, but also the chip carriers prior to assembling them together to form a device.

However, as semiconductor devices operate faster and propagation speed of signals through the carriers becomes more crucial, prior art instruments that merely test for continuity of signal paths are no longer deemed satisfactory.

What is needed for increasing the yield of manufacturing semiconductor devices is a test technique and apparatus that can simulate the operating environment of the carriers.

SUMMARY OF THE INVENTION

In one aspect, this invention relates to a method for manufacturing semiconductor devices each formed by a plurality of chips and a carrier of the chips. The method comprises the step of coupling the chip carrier, prior to population of chips thereon, to a module test card. The module test card comprises a test substrate populated with test chips. The method further comprises the steps of coupling the module test card to a tester, applying a set of test signals to the module test card, monitoring for a set of resultant signals resulting from these test signals and rejecting the carrier if the resultant signals reveal that the carrier is defective.

In another aspect, this invention relates to an apparatus for testing a device chip carrier prior to population of chips thereon to form a semiconductor device. The apparatus comprises a test substrate, a plurality of test chips coupled to the test substrate and a plurality of connectors for coupling the test substrate to a tester.

By testing the carriers and rejecting the defective ones prior to populating chips thereon, rework due to defective carrier is avoided and yield of the manufacturing process will be improved.

DESCRIPTION OF SPECIFIC EMBODIMENTS

Figure 1A:
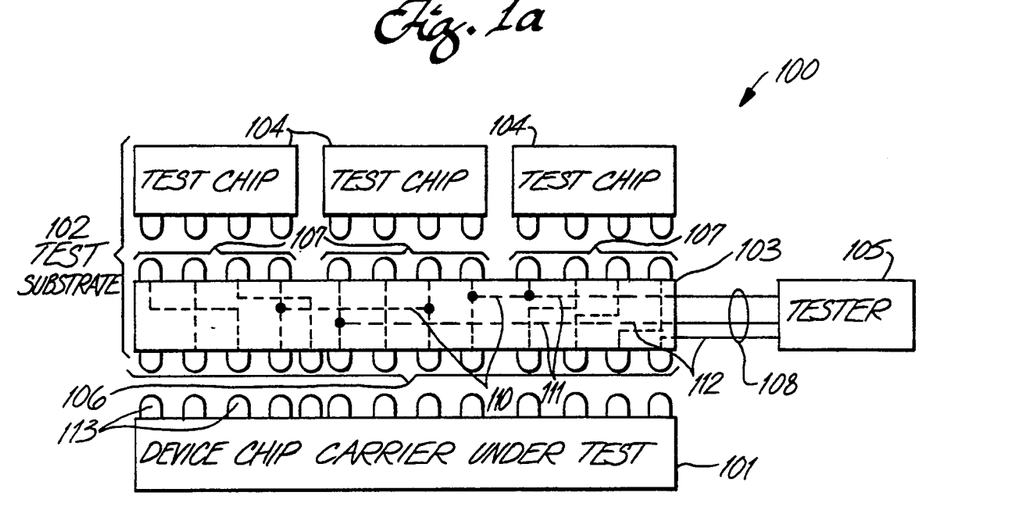
FIGS. 1a–1b illustrate one embodiment of the present invention.

FIG. 1 is a cross-sectional diagram illustrating a chip carrier 101, a thin film test substrate 103 and a plurality of test chips 104 for assembling into a first implementation of the present invention. In a typical manufacturing process wherein the present invention is utilized, the chip carrier 101 is tested prior to committing regular chips thereon, so that it can be rejected if found defective and thus eliminating the need for rework. It should be noted, however, that the present invention can similarly be used to test a carrier during a rework operation. It should also be noted that, rather than testing the whole chip carrier, the present invention may be applied to test only a portion thereof (for example, the portion which holds a newly-designed circuit, or the portions that carry a critical signal path).

Referring back to FIG. 1a, the test substrate 103 and the plurality of test chips 104 form a module test card (MTC) 102 which can be used to successively test different chip carriers.

Testing is performed by connecting the CUT 101 to the MTC 102, which in turn is connected to a tester 105. The tester 105 applies test signals to the MTC 102 and monitors for expected signals resulted therefrom.

The test substrate 103 may be formed conventional techniques such as a printed circuit board made of dielectric material such as ceramic or glass. A teaching of such techniques can be found in "Electronic Packaging and Interconnection Handbook" by C. A. Harper, 1991, published by McGraw-Hill.

When needed by specific applications, the test substrate 103 may be a multi-layer structure comprising of several signal planes and ground planes. Interconnections may be formed on a surface metallization layer and/or within the signal planes. Depending upon specific needs (i.e., depending upon the tests to be performed on the CUT 101, which in turn are depended upon the construction of the CUT 101), these interconnections may include signal paths 110 for interconnecting specific points among the test chips 104, signal paths 109 for interconnecting the test chips 104 and the CUT 101, signal paths 111 for interconnecting the test chips 104 and the tester 105, and signal paths 112 for interconnecting the CUT 101 and the tester 105. Vertical interconnections such as signal paths 109 can be formed by means of through-holes using such techniques as drilling, reactive ion itching or plasma itching.

The test substrate 103 has a first set of connectors 106 on its bottom surface for bonding to the CUT 101. The pattern of this first set of connectors 106 typically match the pattern of connectors 113 on the CUT 101. Preferably, materials are used such that connections between the CUT 101 and the test substrate 103 can be decoupled easily. Material for the first set of connectors 113 is preferably chosen such that the first set of connectors are reusable and the MTC 102 can thus be used for testing more than one CUT.

A second set of connectors 107 are provided on the top surface of the test surface 104 for coupling to the test chips 104.

A third set of connectors 108 are provided on the test substrate 103 for connecting to a tester 105. Without limiting the generality hereof, this third set of connectors 108 may have a geometry and contacts for connecting to a standard tester.

The test substrate 103 can be coupled to the test chips 104 by conventional means such as epoxy bonding, thermoplastic bonding or eutectic die bonding. The test chips 104 can also be bonded to the test substrate 103 using the conventional tape automated bonding (TAB) process. For use with a TAB process, the test substrate 103 would be provided with die attach and outer lead bond sites (see Harper, supra).

The test chips 104 operate to simulate the circuits in the chip(s) of the CUT 101. If the MTC 102 is used for testing a particular portion of the CUT 101, the test chips 104 are implemented to simulate the chips of that portion.

The test chips 104 may be implemented such that they simulate the exact functions of chips of the CUT 101, or only a subset of these functions.

As will be illustrated hereinafter, the test chips 104 may also be implemented such that they perform functions different from those performed by the chips of the CUT 101. For example, one test chip may simply operates to pass a signal sent by the tester 105 into one point of a critical path, while another test chip 104 operates to pass the signal output from the other point of the critical path back to the tester 105. The tester 105 can simply measure the different between the time when it sends the signal and the time the signal is returned. From such measurement, the length of the signal path can be calculated or demonstrated to be within a specified range.

The test chips 104 may contain a plurality of gate array elements implemented into specific logic functions. As discussed, these test functions are dependent upon the tests to be performed which in turn are dependent upon the construction of the CUT 101 and/or the final device. As with conventional gate array, the implementation is achieved by adhering a top metal layer of pathways between the gate array elements into a specific pattern.

Figure 7:
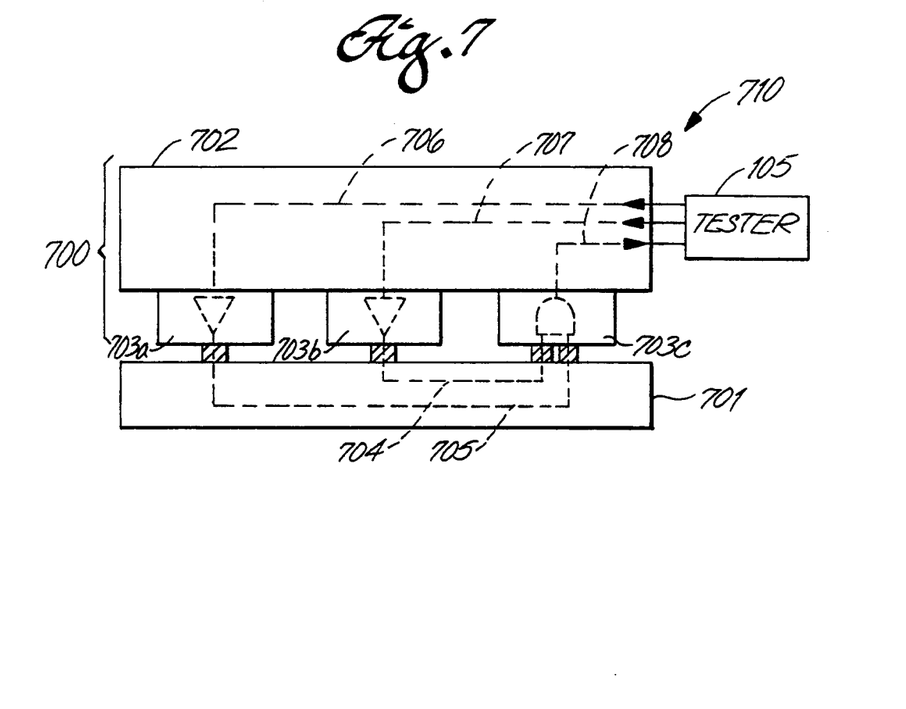
FIG. 7 illustrates yet another exemplary test setup which embodies the present invention.

FIG. 7 is a diagram depicting an example of the above implementation. The implementation comprises a CUT 701 having two signal paths 704, 705. To test whether the signal-to-noise ratio of signal paths 704, 705 in a CUT 701 are within an expected value, a test setup comprising a tester 105 and a MTC 700 are used. The MTC 700 comprises a test substrate 702 and a plurality of test chips 703a, 703b and 703c. A driver is fabricated in each of test chips 703a and 703b. An AND gate is fabricated in test chip 703c.

To test whether the signal-to-noise ratio of paths 704, 705 of a CUT 705 are within the expected value, electric test pulses (preferably with different but overlap active states) are driven from the tester 105 into signal paths 706 and 707. From paths 706 and 707, the test pulses enter the respective drivers of 703a and 703b. The signals coming out of these drivers then enter the AND gate in 703c through paths 704, 705 respectively. The output of the AND gate is received by the tester 105.

If the signal-to-noise ratio of paths 704, 705 in CUT 701 is within an expected value, a predetermined signal pulse will be received by the tester 105. However, if the signal-to-noise ratio of any one of the paths 704, 705 fails, the predetermined signal will not be received by the tester 105. By varying the magnitude and the timing of the test pulses, an estimate of the signal-to-noise ratio of paths 704 and 705 in a CUT can be obtained.

Figure 8:
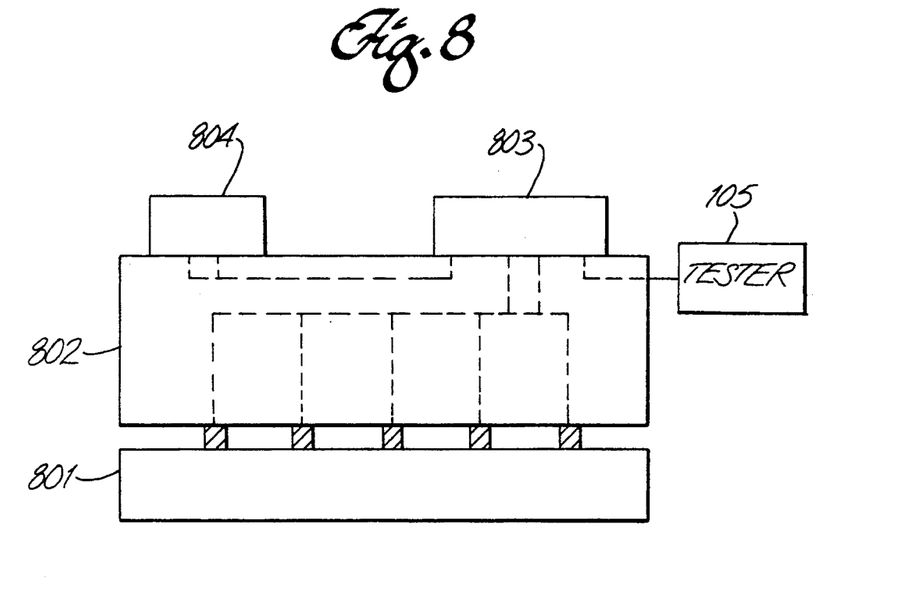
FIG. 8 illustrates yet another exemplary test setup which embodies the present invention.

FIG. 8 illustrate yet another implementation of the present invention. In this implementation, the test chips comprises a processor 803 and memory 804. The processor 803 operates to execute a program stored in the memory 804. The instructions and data of the program are retrieved by the processor 803 from the memory 804 through signal lines internal of the test substrate 802.

Through execution of the program, the processor 803 injects signals to the CUT 801 via the test substrate 802. Certain signals are then received by the processor 803 and stored in the memory 804. When execution of the program completes, the processor 803 retrieves certain data from the memory are forward them to the tester 105. By comparing these data with expected data, the tester 105 can determined whether CUT 105 is defective or not.

Figure 1B:
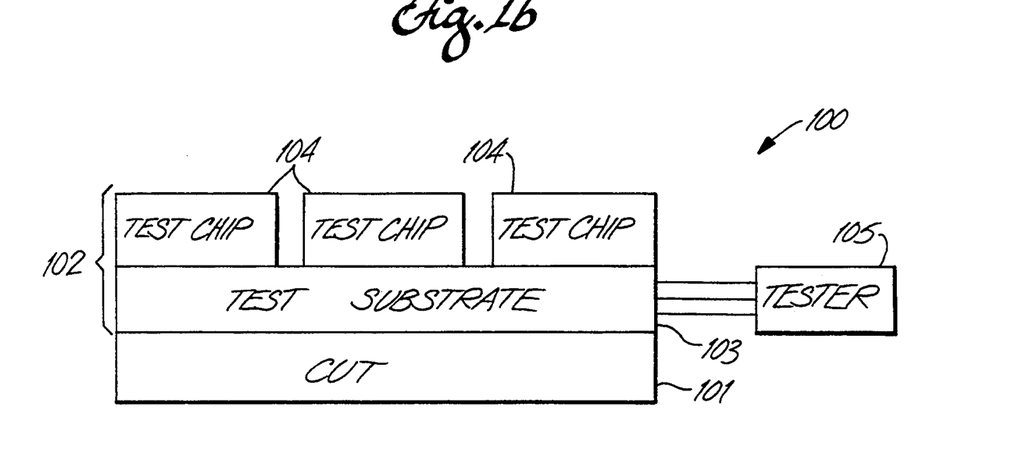

FIG. 1b shows the test setup 100 with the test substrate 103 having the test chips 104 bonded thereon and the CUT 101 coupled thereto.

Figure 2A:
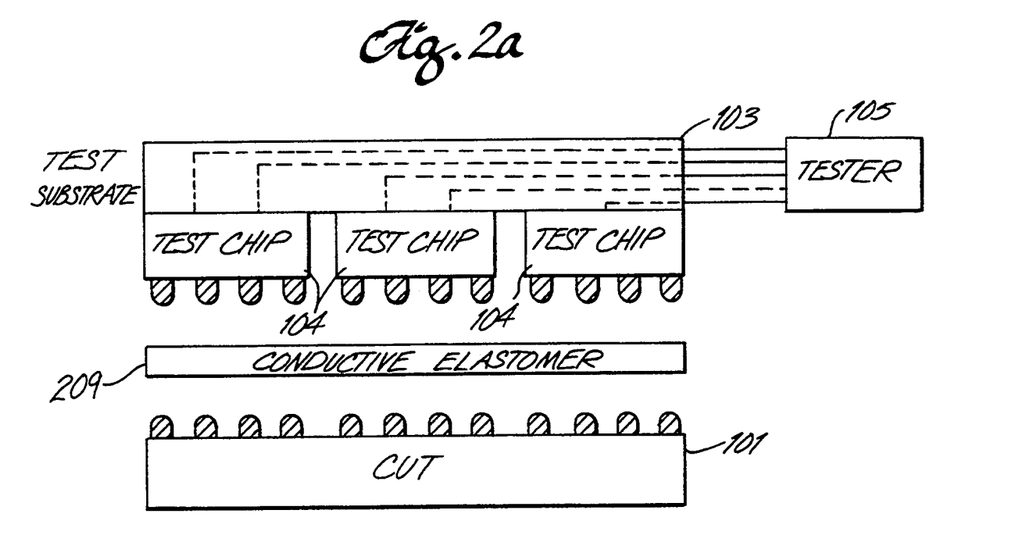
FIGS. 2a–2b illustrate another embodiment of the present invention.
Figure 2B:
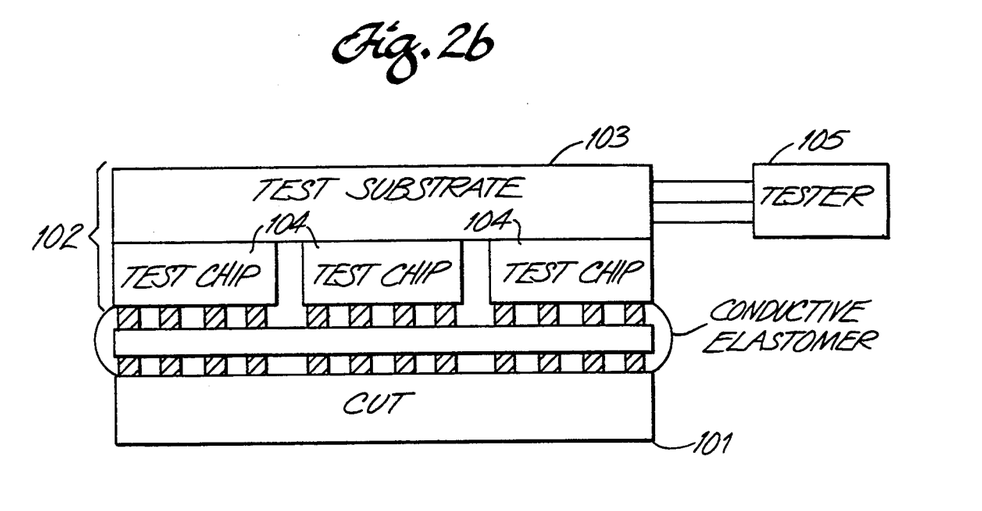

FIGS. 2a and 2b are cross-sectional schematic diagrams illustrating another implementation of the present invention. Such implementation also comprises a test substrate 103, a plurality of test chips 104 and the CUT 101. However, instead of having the CUT 101 itself coupled to the test substrate 103, the CUT 101 is coupled to the test chips 104 which in turn are bonded to the test substrate 103. The connections between the CUT 101 and the test chips 104 is shown in FIGS. 2a and 2b to be made through an electrically conductive adhesive such as an z-axis elastomer 109. However, as disclosed above, other kinds of connections can also be used. It is preferable, however, that materials be used such that connections between the CUT and the MTC can be decoupled easily. It is also preferable that the materials used for coupling to a CUT be reusable.

Figure 3A:
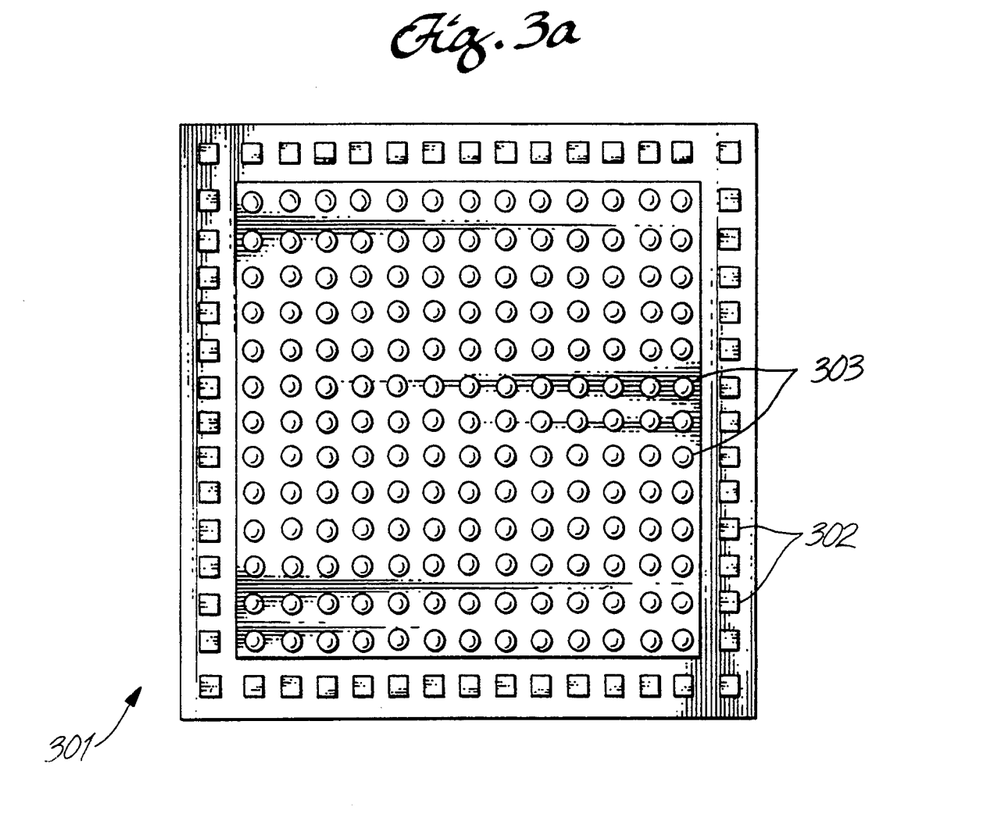
FIG. 3a illustrates an external design of a test chip for use in the implementation of FIGS. 2a–2b.

FIG. 3a illustrates schematically an external design of a test chip 301 for use in the setup 200 of FIG. 2. According to this design, the test chip 301 has a plurality of peripheral bond pads 302 for connecting to the test substrate through conventional tape automated bonding (TAB). The test chip 301 also has a plurality of bumps 303, formed of such material as gold, solder or conductive elastomer, for connecting to the CUT 101. These bumps 303 typically match the bond sites on the CUT 101.

Figure 3B:
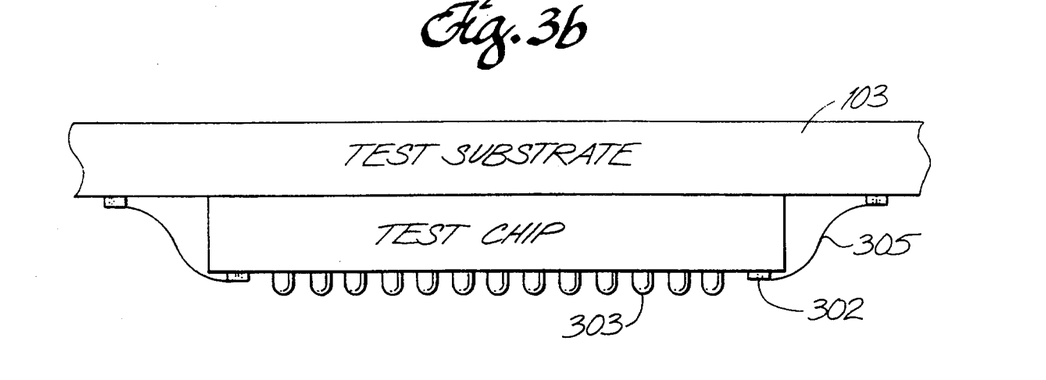
FIG. 3b is a schematic diagram illustrating how the test chip of FIG. 3a is coupled to a test substrate.

FIG. 3b is a diagram illustrating how the test chip 301 of FIG. 3a is bonded to the test substrate 103. As shown, the peripheral bond pads 302 of the test chip 301 are attached to the inner lead bond of the TAB tape 305. The bumps 303 are taller than the total thickness of the TAB tape 305 and the TAB bond pads 302

Figure 4:
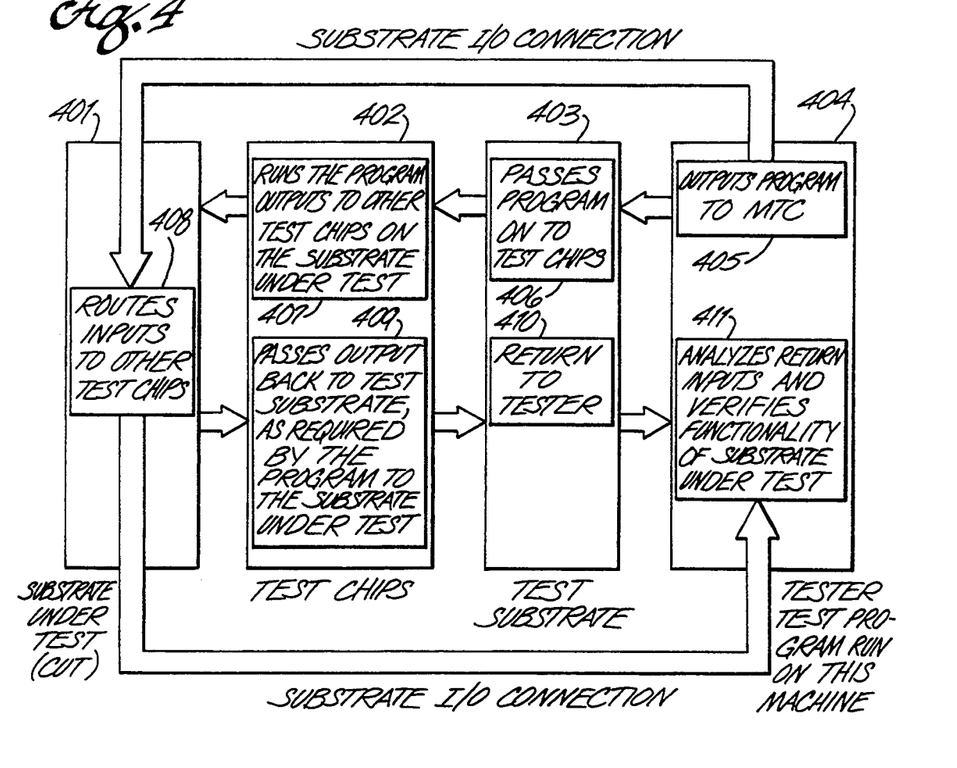
FIG. 4 illustrates how a test is performed on a carrier under test (CUT) in accordance to the present invention.

FIG. 4 illustrates how a test is performed on a CUT 101 under the present invention. The test is illustrated using the setup 200 of FIGS. 2a and 2b.

Referring to FIG. 4, the CUT 101 in FIGS. 2a and 2b is represented as block 401. The CUT 101 is connected to the test chips 104 which is represented in FIG. 4 as block 402. The test chips 402 are coupled to the test substrate 103 which is represented in FIG. 4 as block 403. The test substrate 403 is in turn coupled to a tester 105, which is represented in FIG. 4 as block 404.

To test the CUT 401, a test program is executed in the tester 404. This test program may actually be a utility-/application program (e.g. a Lotus 1-2-3 program). In executing the test program, a plurality of signals are output from the tester 404 to the MTC (block 405). Through interconnections in the test substrate 403, the signals are passed to the test chips 402 (block 406).

Within the test chips 402, the signals may either be changed into a new set of test signals; or they may simply be output to the CUT 401. The signals travel through signal paths within the CUT 410 and return to the test chips (blocks 407 and 408). Depending upon the implementation, the test chips 402 may pass these resultant signals (or a subset thereof) back to the tester (block 409) or they may re-send the signals back to the CUT 401. Ultimately, the resultant signals are collected by the tester 405 (block 410) and analyzed (block 411). Such analysis may simply a check to see whether the application program is run properly. The analysis will verify that the electrical capacitance, inductance, resistance and impedance of the signal paths in the carrier are within a specified range, that ism the signal-to-noise ratio of data transmitted through the carrier is readable by the receiving chip in the module test card.

Figure 5:
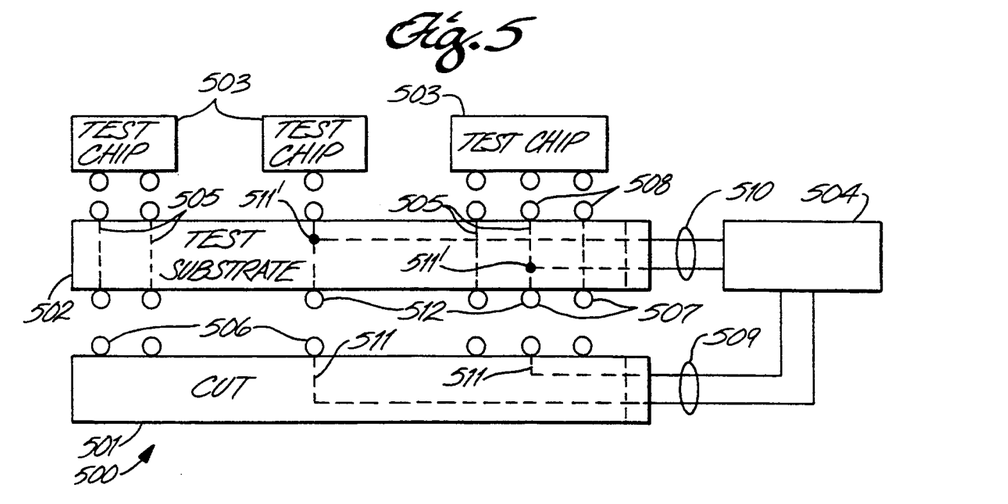
FIG. 5 illustrates an exemplary test setup which embodies the present invention.

FIG. 5 illustrates one implementation of the present invention. The setup 500 comprises a plurality of tests chips 503, a test substrate 502 and a CUT 503.

It is assumed for this implementation that the CUT 501 is a motherboard to be populated with a set of semiconductor chips to form a computer. it is also assumed that, as in typical motherboards, that the CUT 501 has one or more input/output (I/O) connectors 509 for connecting to external devices such as disks, keyboards and/or monitors (not shown). Since signals to the I/O connectors 509 would typically originated from or received by a chip, the CUT 501 has a plurality of bond sites 511 that are connected to the I/O connector(s) 509. These bond sites are hereinafter referred to as the "I/O bond sites".

To test the CUT 501, a module test card according to the present invention is formed. The module test card comprises a test substrate 502 having top and bottom surfaces. Both surfaces have contacts that match the bonding sites 506 on the surface of the CUT 501. In other words, each bonding site on the CUT 501 has a corresponding contact 508 on the top surface and a corresponding contact 507 on the bottom surface of the test substrate 502. Each pair of corresponding contacts 507, 508 are connected by through-hole connection 505.

On the side of the test substrate 502, one or more I/O connector(s) 510, corresponding to the connector(s) 509 on the CUT 501, are provided. Interconnections 511' are formed between the connector(s) and contact points 512 that correspond to the I/O bond sites 511.

A set of test chips 503 is mounted on the top surface of test substrate 502. In this exemplary test setup 500, the test chips 503 are identical to the chips that will finally be mounted onto the CUT 501 to form the computer.

The CUT 501 is coupled to the bottom surface of the test substrate 502 by means of z-axis elastomer. A set of external devices 504 is connected to test setup 500 through I/O connector(s) 510.

The CUT 501, test substrate 502 and test chips 503, when coupled together as described hereinabove, basically form the computer.

After the computer is formed as described above, a benchmark program is run. This benchmark program may comprise one or more application software. If the benchmark program runs successfully, the CUT 501 is considered to be free of defects. It is then decoupled from test substrate 502 and passes to final assembly.

Figure 6:
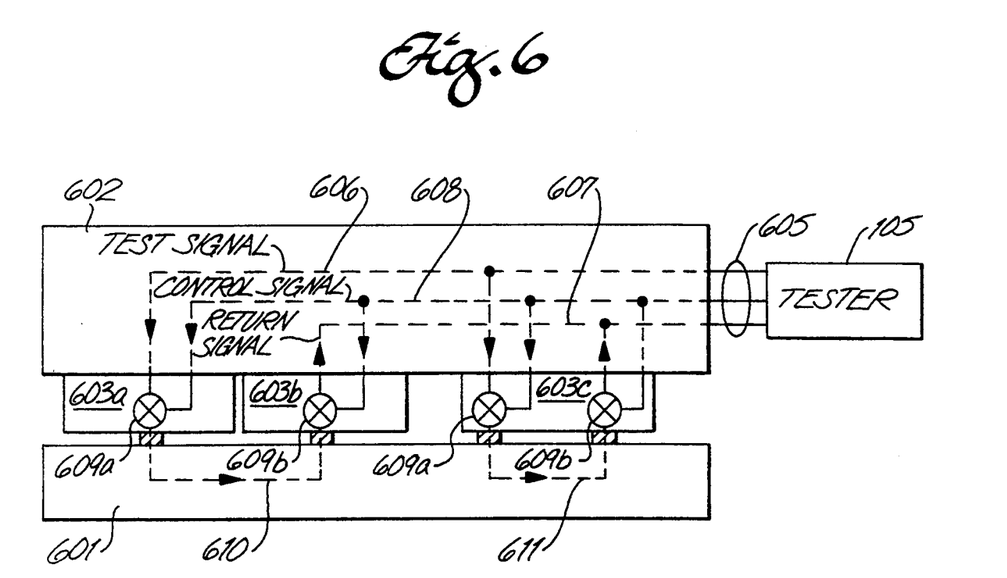
FIG. 6 illustrates another exemplary test setup which embodies the present invention.

FIG. 6 illustrates how the length of critical paths 610 and 611 in a CUT 601 can be tested.

The CUT 601 can be tested by a MTC which comprises a test substrate 602 and a plurality of test chips 603. The test substrate 602 has a plurality of signal paths, including a signal path 606 which carries a test signal from the tester 105 to the CUT 601 via the test chips 603. This test signal can travel through the CUT 601 in either path 610 or 611. The selection of which of paths 610 and 611 to be travelled by the test signal is controlled by switches 609 which in turn are controlled by a control signal 608 from the tester 105. When a path is selected, the corresponding return path is also selected by controlling switches 609b so that the test signal can return to the tester 105 via path 607.

To illustrate, the tester 105 first tests path 610 by setting switches 609a and 609b with control signal 608. The tester 105 then sends a test signal to path 606. The test signal travels from the tester 105 through path 606 to 603a and to path 610. It returns to the test substrate 602 through 603b and finally to the tester 105 through path 607. The tester 105 measures the difference between time the test signal is sent and the time the return signal is received. From the difference, the length and the signal-to-noise ratio of path 610 can be determined.

The tester 105 can similarly test path 611 by setting switches 609a and 609b so that the test signal travels through path 610 to 611 through test chip 603c returns to the tester 105 through test chip 603c and path 608.

The above discloses a technique and apparatus for testing a chip carrier prior to population of chips thereon. The testing is performed through a module test card which provides means for converting signals from the tester into signals that simulate operating environment of the semiconductor device. Through such conversion, more accurate testing can be performed on the carrier.

A description of the particular embodiment is given above for the understanding of the present invention. It will be understood by those skilled in the art that various modifications and additions can be made without substantially departing from the scope of this invention which is defined by the following claims.

What is claimed is:

1. In manufacturing semiconductor devices formed respectively by a plurality of semiconductor chips and a carrier of the chips, a method for increasing production yield through more refined testing methods, comprising the steps of:
   coupling, prior to population of the semiconductor chips thereon, the carrier to a module test card, said module test card having a test substrate and a plurality of test chips on the test substrate, the substrate being adapted for successively coupling to a plurality of carriers and for communicating electrical signals between a connector of one of the test chips and a respective connector on the carrier such that the connector on the test chip correlates to a connector on one of the plurality of semiconductor chip that communicates with the respective connector on the carrier after the carrier is populated with the semiconductor chips, the test chips being operable to simulate a portion of the chips;

coupling said module test card to a tester;

testing said carrier utilizing said module test card to generate test results; and comparing the test results with expected results to accept or reject the carrier.

2. A method as claimed in claim 1 wherein said testing step comprises a step of simulating one or more operations of the semiconductor devices.

3. A method as claimed in claim 1 wherein said coupling step comprises a step of connecting said carrier to said module test card using reusable electrical conductive material.

4. A method as claimed in claim 3 wherein said coupling step comprises a step of connecting said carrier to said module test card using a layer of z-axis elastomer.

5. A method as claimed in claim 3 wherein said coupling step comprises a step of connecting said carrier to said module test card using a set of contact bumps.

6. A method as claimed in claim 5 wherein said contact bumps being formed with gold.

7. A method as claimed in claim 6 wherein said contact bumps are solder.

8. A method as claimed in claim 3 wherein said coupling step comprises a step of connecting said carrier to said module test card using a tape automated bonding process.

9. An apparatus for testing a carrier of semiconductor chips prior to population of the chips thereon to form a semiconductor device, the carrier having a first plurality of connectors, the semiconductor chips each having a plurality of connectors, the apparatus comprising:

a test substrate having a second and third plurality of connectors, the second plurality of connectors being arranged in a pattern corresponding to the pattern of the plurality of connectors on the semiconductor chips;

a plurality of test chips coupled to the test substrate, each test chip having a plurality of connectors, each such plurality of connectors being arranged in a pattern corresponding to the pattern of a respective portion of the second plurality of connectors of the test substrate, the plurality of test chips being operable to simulate the semiconductor chips, the test substrate being adapted to communicate electrical signals from a connector on a test chip to a respective connector of the second plurality of connectors and to communicate the electrical signals from such a connector of the second plurality of connectors to a respective connector of the third plurality of connectors for communication with the carrier;

means for electrically coupling the third plurality of connectors of the test substrate to the first plurality of connectors of the carrier; and means for electrically coupling the test substrate to a tester.

10. An apparatus as claimed in claim 9 wherein said test chips comprise a set of chips having a gate array.

11. An apparatus as claimed in claim 9 wherein said test chips comprise a set of chips forming a memory.

12. An apparatus as claimed in claim 9 wherein said test chips comprise a set of chips forming logic circuits for performing functions of a data processing unit.

13. An apparatus as claimed in claim 12 wherein said test chips further comprise a set of chips forming a memory.

14. An apparatus as claimed in claim 9 wherein said means for coupling said test substrate to said carrier comprises a layer of electrically conductive material.

15. An apparatus as claimed in claim 14 wherein said layer of electrically conductive material is reusable.

16. An apparatus as claimed in claim 14 wherein the means for coupling said test substrate to said carrier comprises a layer of z-axis elastomer.

17. An apparatus as claimed in claim 9 wherein said means for coupling said test substrate to said carrier comprises a set of contact bumps.

18. An apparatus as claimed in claim 17 wherein said contact bumps are formed with gold.

19. An apparatus as claimed in claim 17 wherein said contact bumps are formed with solder.

20. An apparatus as claimed in claim 9 wherein said means for coupling said test substrate to said carrier comprises means for coupling said test substrate and said carrier by a tape automated bonding process.

* * * * *